United States Patent [19]

Remy et al.

[11] Patent Number: 4,682,122

[45] Date of Patent: Jul. 21, 1987

[54] FREQUENCY SYNTHESIZER STAGE ADDING HIGH FREQUENCY STEPS TO AN INITIAL FREQUENCY

[75] Inventors: Joël Remy, Paris; Roger Charbonnier, Meudon Bellevue, both of France

[73] Assignee: Adret Electronique, Trappes, France

[21] Appl. No.: 786,975

[22] Filed: Oct. 15, 1985

[30] Foreign Application Priority Data

Jun. 1, 1984 [FR] France ................................ 84 08650

[51] Int. Cl.[4] ............................................. H03L 7/18
[52] U.S. Cl. ......................................... 331/2; 331/25; 331/38
[58] Field of Search .................... 331/2, 19, 25, 11, 38

[56] References Cited

U.S. PATENT DOCUMENTS 4,458,329 7/1984 Remy ...................... 331/2

Primary Examiner—Siegfried H. Grimm
Attorney, Agent, or Firm—William A. Drucker

[57] ABSTRACT

A frequency synthesizer for adding large frequency steps to an initial frequency. A first phase lock loop divides the input frequency $Fo+\Delta$ ($\Delta$ being the sum of smaller frequency steps) by a rational division factor and adds to the result a standard frequency P in a fixed integral ratio with the large frequency steps to form an intermediate frequency Fi. A second phase lock loop ($O_S$-E-G-$D_3$-$CPF_2$-$FL_3$) multiplies the intermediate frequency by a rational factor, equal to $(N+1)/D$. This second loop first divides (in $D_3$) the intermediate frequency by an integral fixed ratio D and then compares (in $CPF_2$) the result $Fi/D$ to a beat between the output frequency Fs and a harmonic N-Fi of the intermediate frequency.

4 Claims, 2 Drawing Figures

4,682,122

FREQUENCY SYNTHESIZER STAGE ADDING HIGH FREQUENCY STEPS TO AN INITIAL FREQUENCY

BACKGROUND OF THE INVENTION

1. Field of the Invention

The invention concerns the output stages of a frequency synthesizer, stages which are designed to add large frequency steps to a frequency derived from preceding stages and which itself comprises smaller frequency steps.

2. Description of the Prior Art

The method is already known, from applicant's French patent No. 73 17650 to realize such a frequency summation by means of two current or voltage controlled oscillators, each controlled by a phase lock loop, a first loop dividing the frequency $Fo+\Delta$ derived from preceding stages ($\Delta$ being the sum of the low steps) by a variable integer N by means of a programmable divider and adding to it a standard frequency P which represents the high step, while a second loop multiplies the intermediate frequency Fi supplied by the first loop by the same factor N so as to give an output frequency $Fs=Fo+\Delta+NP$.

This solution is particularly useful when one desires to cover a range of output frequencies extending up to several gigahertz, the second oscillator then being of the YIG type. It has the advantage that, since this second oscillator is controlled on a sub-multiple of its own frequency, this frequency does not run the risk of being affected by the harmonics of Fi.

However, as N varies, the phase comparator of the second loop must obviously be of the sampler type, the frequency Fs of the output oscillator there being compared to a harmonic of variable rank N of the frequency Fi.

Now, it is known that a sampler, generally constituted by a capacitance-resistance and diodes bridge, equivalent to a switch through which the signal to be sampled is applied to a capacitor, the said switch being controlled by a pulse, generates in practice, owing to the necessary dissymmetry of pulses (supplied here by the harmonic generator), in addition to the wanted signal (oscillator direct-current control signal) whose level is very low, an additional direct-current componenet which results from the detection of pulses by the diodes. The level of this parasitic component evolves inside the frequency range and may, as regards certain frequency ranges, attain values greater than those of the wanted signal. Automatic control of the oscillator is not possible inside these ranges.

This drawback can be eliminated by comparing the beat between Fs and NFi obtained in the sampler to a carrier frequency comprising a fixed part Fo and, possibly, a variable part $\Delta$ (the first loop thus generating a frequency $Fi=NP+\Delta$ or, possibly, $Fi=NP$).

In such circumstances, the signal derived from the sampler is an alternating-current signal having a considerable amplitude and it is no longer affected by the parasitic signal.

On the other hand, the advantage previously mentioned is eliminated, since Fs is no longer a multiple of Fi.

OBJECT OF THE INVENTION

The invention claims to eliminate the above-mentioned drawback by only using in the second loop frequencies which are harmonics of each other.

SUMMARY OF THE INVENTION

According to a first characteristic feature of the invention, this result is obtained by comparing, preferably in a frequency-phase comparator, the beat between Fs and NFi and a frequency Fi/D obtained by dividing Fi into a fixed divider of integer ratio D.

The multiplication ratio realized by the second loop thus being $N+1/D$, it is then necessary for the first loop to perform a division by $N+1/D$, this being effected without the frequency division which precedes the phase comparator of the first loop occuring with an ND ratio: in effect, a factor D would thus be lost on the phase noise resulting from the automatic control of the first oscillator.

According to a second characteristic feature of the invention, the circuit arrangement which generates Fi comprises an auxiliary oscillator controlled firstly from the algebraic sum of the frequency $Fo+\Delta$ and its own frequency $F_A$ and secondly from a frequency $F_A/ND$ resulting from the division of its own frequency by N and D, and it is this auxiliary frequency $F_A$ which drives the first above-mentioned loop which divides it by N and adds P to it with the result that one has:

$$F_A=(Fo+\Delta)/(1+1/ND) \text{ and}$$
$$Fi=(Fo+\Delta)/(N+1/D)+P$$

Thanks to this second characteristic feature of the invention, the oscillator of the first loop is controlled from the frequency $F_A/N$, $F_A$ being of the same order of magnitude as $Fo+\Delta$, with the result that no factor D is lost on the phase noise.

According to a third characteristic feature of the invention, the ratio D is preferably taken equal to 4; the phase comparators of the auxiliary loop and output loop are of the frequency-phase comparator type and an inversion of the connection of their inputs with the frequencies to be compared is provided for.

A result of this is a doubling of the number of frequency steps which the device can generate for a given input frequency band.

BRIEF DESCRIPTION OF THE DRAWING

Other characteristic features, as well as the advantages of the invention, will become apparent from the following description.

In the appended drawings.

DESCRIPTION OF THE PREFERRED EMBODIMENT

Figure 1:
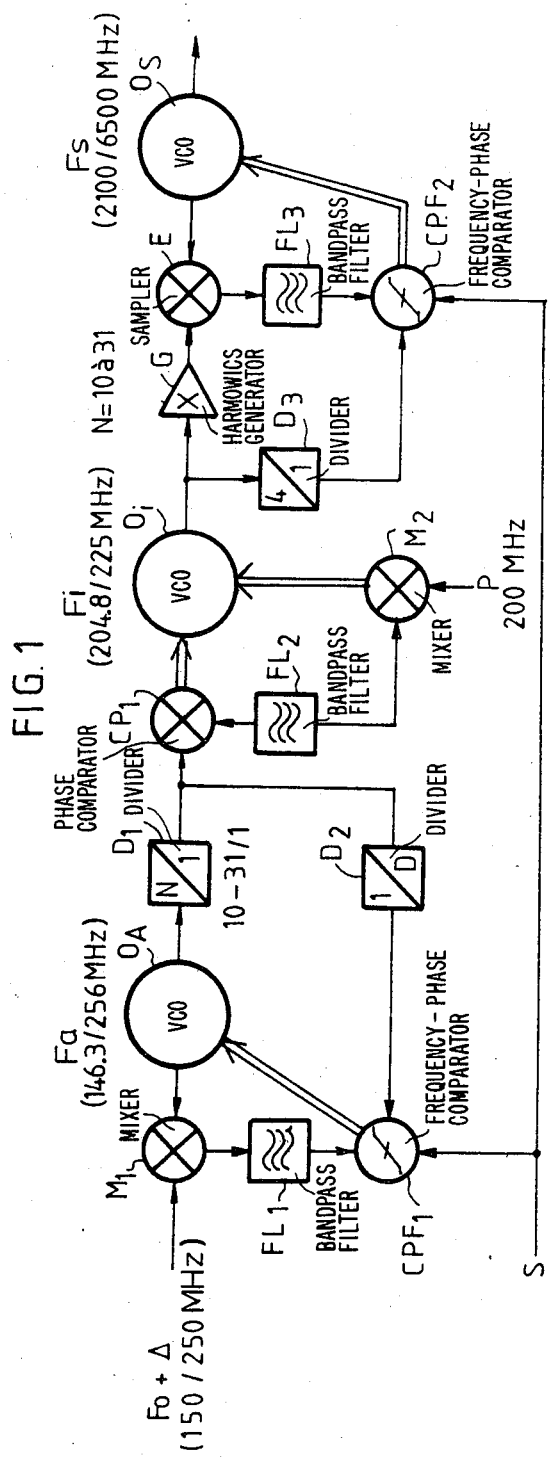
FIG. 1 is a block diagram of a frequency synthesizer stage in accordance with a preferred embodiment of the invention.

In FIG. 1, the output stage is represented of a frequency synthesizer designed, for example, to generate an output frequency Fs varying between 2100 and 6500 HMz and whose larger steps are of 100 MHz.

The input frequency derived from preceding stages comprises a carrier frequency Fo=150 MHz and an increment Δ which varies from 0 to 100 MHz and represents the sum of the small steps.

It drives a mixer $M_1$ which moreover receives a frequency $F_A$ generated by an oscillator $O_A$ controlled by a d.c. voltage derived from a frequency-phase comparator $CPF_1$. The comparator $CPF_1$ receives firstly the beat between $Fo+\Delta$ and $F_A$ filtered through a bandpass filter $FL_1$, and secondly the frequency $F_A$ divided by ND in two dividers $D_1$, $D_2$. The divider $D_1$ has a ratio N varying between 10 and 31, the divider $D_2$ having a ratio D equal to 4. Thus, in the stationary state of the control loop, it can be written:

$Fo+\Delta-F_A=F_A/ND$ in which
$F_A=(Fo+\Delta)/(1\pm 1/ND)$

The frequency $F_A/N$ derived from $D_1$ is applied to a phase comparator $CP_1$ which also receives the output frequency, filtered through a bandpass filter $FL_2$, of a mixer $M_2$. This mixer receives firstly a standard frequency P equal, in the example, to 200 MHz, and secondly the output frequency of an oscillator $O_i$ controlled by the d.c. voltage derived from $CP_1$. When the control loop of Fi is stabilized, the following can be written:

$(Fo+\Delta)/(N\pm 1/D)=Fi-P$ in which
$Fi=P+(Fo+\Delta)/(N\pm 1/D)$

The frequency Fi is firstly applied to a sampler E through a harmonics generator G and secondly to a frequency-phase comparator $CPF_2$ through a divider $D_3$ by D. The comparator $CPF_2$ also receives the beat, filtered through $FL_3$, between the harmonics of the frequency Fi and the output frequency Fs of an oscillator $O_S$ controlled by the d.c. output voltage of $CPF_2$.

Thus one has:

$NFi\pm Fs=Fi/D$ in which $Fs=Fi(N\pm 1/D)$

Thus finally one has, for D=4:

$$Fs = \left( \frac{Fo + \Delta}{N + S/4} + P \right) (N + S/4)$$

S being equal to $\pm 1$ and determined by a direction bit S applied to the comparators $CPF_1$ and $CPF_2$, as shall be explained subsequently. Thus $Fs=Fo+\Delta+(N+S/4)\cdot P$ If one poses $2Q=S+1$ (thus Q=0 or 1):

$$Fs = Fo + \Delta + \left( N + \frac{2Q-1}{4} \right) \cdot P =$$

$$Fo - P/4 + \Delta + NP + QP/2$$

Figure 2:
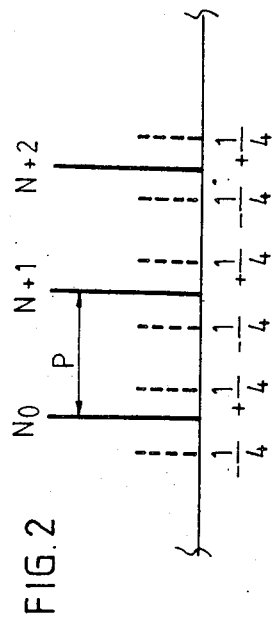
FIG. 2 illustrates the spectrum of output frequencies of the said stage.

In FIG. 2, the spectral lines are represented which correspond to the successive values of N and are spaced from each other by P, together with the frequencies resulting from the addition of $QP/2-P/4$. For Q=0, these frequencies are offset by $-P/4$ in relation to the lines and, with Q=1, they are offset by P/4. Finally, one obtains $2\Delta N$ steps of P/2 ($\Delta N$ being the number of values of N).

By way of example, by making N vary from 10 to 31, an output frequency is obtained which varies between 2100 and 6500 MHz by steps of 100 MHz.

It will be observed that, in the circuit arrangement described, all the frequencies used (Fi, NFi, Fi/4) are all multiples or submultiples of each other, which eliminates the risk of disturbing interferences. In addition, the sampler E generates an alternating frequency beat which is not cancelled and this eliminates control problems.

Secondly, with the oscillator $O_i$ being controlled on a frequency $F_A/N$, thus close to $(Fo+\Delta)/N$, the noise introduced by its control is of the same order of magnitude as in the known circuit arrangement in which the oscillator of the first loop is controlled on $(Fo+\Delta)/N$.

The oscillator $O_A$ of the auxiliary loop is itself controlled from the frequency $F_A/ND$; but the comparator $CPF_1$ in turn receives the frequency $|(Fo+\Delta)-F_A|$ in which any phase noise on $F_A$ is entirely transferred: it is therefore the noise on this latter frequency which is dominant, the auxiliary loop not finally in practice multiplying the noise.

Finally, it will be observed that, by doubling the number of steps for a given variation of the input frequency, it is possible to cover, for example, the output frequency range extending from 2100 to 6500 MHz by using an input frequency of from 150 to 250 MHz only, instead of 250 to 450 MHz.

This characteristic feature considerably reduces the diffculty of synthesizing the input frequency, the noise performances being the more improved as the frequency range to be covered is narrower.

It should be emphasized that the use of a doubled number of steps assumes that $CPF_1$ operates, depending on the output frequencies to be generated, according to one or other of two distinct modes, one in which $(Fo+\Delta)$ is greater than $F_A$ and the other in which the opposite is the case, and that $CPF_2$ also operates according to a first mode where G.Fi is greater than Fs and a second mode in which the opposite is true. In the first mode, when the frequency of the oscillator decreases, the frequency of the beat increases, which allows equilibrium to be re-established, provided that the frequency-phase comparator supplies a suitable control voltage to make the frequency of the oscillator decrease when it deviates from equilibrium through frequency excess of the oscillator. In the second mode, when the frequency of the oscillator decreases, the frequency of the beat also decreases. However, equilibrium is possible, for the frequency of the beat decreases by the same value as that of the oscillator, while the decrease of frequency to which the beat is compared is for example ND times weaker. But, in order to re-establish equilibrium, it is then necessary for the frequency-phase comparator to supply a suitable control voltage for increasing the frequency of the oscillator when it deviates from equilibrium through excess of frequency of $F_A/ND$. This result, which could not be obtained with a sampler or a mixer, can be obtained with a frequency-phase comparator. For example, all that is required is inversion of the connections between the two input frequencies of the comparator and the two input terminals of the latter. In practice, the bit S will thus control a first switching device connecting the outputs of $FL_1$ and $D_2$ to two input terminals of $CPF_1$ and a second switching device connecting the outputs of $D_3$ and $FL_3$ to the two input terminals of $CPF_2$.

It will be observed that the frequency-phase comparator also permits the necessary frequency approach device (not illustrated) to be much rougher than would be the case with a mixer. This device will be easy to realize in a wide range of frequencies, despite errors of linearity and the drifts of the output oscillator and the approach device itself.

It should be understood that various changes could be made in the above-described and shown circuitries, without departing from the scope of the invention.

What is claimed is:

1. A frequency synthesizer for generating an output frequency Fs by adding large frequency steps to a frequency itself comprising smaller frequency steps and comprising first and second circuits, each of said circuits including at least one current or voltage controlled oscillator controlled by a phase lock loop, the first circuit dividing, by means of a programmable divider, the input frequency Fo+$\Delta$ ($\Delta$being the sum of the small steps) by a rational division factor and adding to the result of this division a standard frequency P which is in a fixed integral ratio with the large steps so as to give an intermediate frequency Fi, while the second circuit multiplies the said intermediate frequency by the said rational factor, wherein the second circuit divides the intermediate frequency Fi by a fixed integral ratio D and compares the result Fi/D of the division to a beat between the output frequency Fs and a harmonic N. Fi of the intermediate frequency, while the said rational factor is N+1/D.

2. A frequency synthesizer as claimed in claim 1, wherein the first circuit includes an auxiliary phase lock loop comprising an auxiliary oscillator and a comparator, said comparator receiving firstly the beat between the input frequency Fo+$\Delta$ and the frequency of the auxiliary oscillator and secondly the result of the division of the frequency of the auxiliary oscillator by the product ND, and a main phase lock loop comprising a main oscillator and a further comparator, said further comparator receiving firstly a beat between the standard frequency P and the frequency Fi of the main oscillator and secondly the result $F_A/N$ of the divisionn by N of the frequency of the auxiliary oscillator.

3. A frequency synthesizer as claimed in claim 2, wherein the comparator of said auxiliary phase lock loop is a frequency-phase comparator and the second circuit also includes a frequency-phase comparator.

4. A frequency synthesizer as claimed in claim 3, wherein the fixed division ratio D is equal to 4 and means are provided to effect an inversion of the connections of the frequencies to be compared at the inputs of each of said frequency-phase comparators.

* * * * *